United States Patent
Zhan et al.

(10) Patent No.: US 10,151,195 B2
(45) Date of Patent: Dec. 11, 2018

(54) ELECTRONIC DEVICES FOR HIGH TEMPERATURE DRILLING OPERATIONS

(71) Applicants: China Petroleum & Chemical Corporation, Beijing (CN); Sinopec Tech Houston, LLC., Houston, TX (US)

(72) Inventors: Sheng Zhan, Houston, TX (US); Jinhai Zhao, Houston, TX (US); Herong Zheng, Houston, TX (US); Weiping Xu, Houston, TX (US)

(73) Assignees: CHINA PETROLEUM & CHEMICAL CORPORATION, Beijing (CN); SINOPEC TECH HOUSTON, LLC., Houston, TX (US)

( * ) Notice: Subject to any disclaimer, the term of this patent is extended or adjusted under 35 U.S.C. 154(b) by 282 days.

(21) Appl. No.: 14/265,272

(22) Filed: Apr. 29, 2014

(65) Prior Publication Data
US 2015/0313010 A1  Oct. 29, 2015

(51) Int. Cl.
E21B 47/01 (2012.01)
E21B 47/12 (2012.01)
E21B 17/16 (2006.01)

(52) U.S. Cl.
CPC ............ *E21B 47/12* (2013.01); *E21B 47/011* (2013.01); *E21B 17/16* (2013.01)

(58) Field of Classification Search
CPC combination set(s) only.
See application file for complete search history.

(56) References Cited

U.S. PATENT DOCUMENTS

| | | | | |
|---|---|---|---|---|
| 4,193,106 A * | 3/1980 | Coleman | ............... | H01G 2/14 361/275.4 |
| 4,350,618 A * | 9/1982 | Hilson | ............... | H01B 1/16 106/1.13 |
| 4,517,252 A * | 5/1985 | Hugh | ............... | H01B 1/02 252/514 |
| 5,467,083 A * | 11/1995 | McDonald | ............ | E21B 47/122 340/854.4 |
| 5,481,135 A * | 1/1996 | Chandra | ............. | C04B 41/4554 257/701 |
| 5,998,000 A * | 12/1999 | Ikeda | ............... | H01L 23/3735 174/259 |
| 6,268,726 B1 * | 7/2001 | Prammer | ............... | G01V 3/32 324/300 |

(Continued)

OTHER PUBLICATIONS

Chet Guiles, Everything You Ever Wanted to Know About Laminates but Were Afraid to Ask, Nov. 2008, Arlon-Materials for Electronics, pp. 1-103.*

*Primary Examiner* — D. Andrews
*Assistant Examiner* — Ronald R Runyan
(74) *Attorney, Agent, or Firm* — Novick, Kim & Lee, PLLC; Allen Xue

(57) ABSTRACT

The present disclosure provides the printed circuit board assembly suitable for operating downhole at high temperatures. The printed circuit board assembly has a ceramic circuit board with a plurality of chips installed on it. At least one of the chips has an aluminum nitride or a silicon nitride substrate. In some of the chips, aluminum nitride is used as the oxide layer in a Si-on-Insulator configuration. In other chips, integrated circuits are fabricated on a substrate made from aluminum nitride, silicon nitride, silicon carbide, or sapphire.

6 Claims, 2 Drawing Sheets

(56) References Cited

U.S. PATENT DOCUMENTS

| | | | | |
|---|---|---|---|---|
| 2001/0042643 A1* | 11/2001 | Krueger | .................. | E21B 7/062 |
| | | | | 175/73 |
| 2001/0055838 A1* | 12/2001 | Walker | .................. | H01L 21/822 |
| | | | | 438/129 |
| 2004/0102023 A1* | 5/2004 | Morozumi | .......... | H01L 23/3735 |
| | | | | 438/460 |
| 2004/0165830 A1* | 8/2004 | Cote | .................... | G02B 6/3897 |
| | | | | 385/52 |
| 2005/0098318 A1* | 5/2005 | Rodney | ................ | E21B 36/003 |
| | | | | 166/302 |
| 2009/0038794 A1* | 2/2009 | Yamate | ................ | E21B 47/123 |
| | | | | 166/254.2 |
| 2009/0242250 A1* | 10/2009 | Kohda | .................... | B32B 15/08 |
| | | | | 174/259 |
| 2009/0244848 A1* | 10/2009 | Lim | .................... | H01L 23/4334 |
| | | | | 361/709 |
| 2012/0093193 A1* | 4/2012 | Desroques | ............ | E21B 47/011 |
| | | | | 374/136 |
| 2013/0087903 A1* | 4/2013 | Cherchali | ............ | E21B 47/011 |
| | | | | 257/690 |

\* cited by examiner

ELECTRONIC DEVICES FOR HIGH TEMPERATURE DRILLING OPERATIONS

TECHNICAL FIELD

The present disclosure relates to electronic devices for high temperature drilling operations, particularly relates to the printed circuit board assembly suitable for downhole environment and the method of making it.

BACKGROUND

Modern oil and gas explorations are carried out in complex geologic settings. The drilling operations rely heavily on real time information on the status of the drilling tools as well as the earth formation properties. The information is obtained using sensors and measurement-while-drilling (MWD) and logging-while-drilling (LWD) instruments. Although MWD refers to the measurement of the movement and location of the drilling assembly while the drilling continues and LWD focuses more on the measurement of formation properties, they are used interchangeably in this disclosure. MWD/LWD instruments are often installed in the drill collar inside the drilling assembly (i.e., bottom hole assembly or BHA).

Alternative to or complimentary to the MWD/LWD instruments, wireline logging may be used to examine the earth formation. Typically, after the drill string is removed from the borehole, a sonde is lowered to the bottom of the region of interest and subsequently pulled upward. On the upward trip, the sonde measures the properties of the formation along its path.

Sensors are employed to obtain measurements in both the MWD/LWD instruments and the wireline logging approach. Other electronic components include active components, such as printed circuit board assemblies (PCBA) and transistors, or passive components, such as resistors and capacitors.

PCBAs are used throughout the drilling system. For example, they can be used in the operation of the power supply, temperature sensors, pressure transducers, the battery, etc. PCBAs such as the master memory board, the read out board, the transmitter or a receiver board, and the accelerometer board are among electronic devices commonly used in a downhole environment.

PCBAs can be coupled to various sensors in a drilling system by known methods. In some embodiments, sensors may be integrated on a master memory board. Sensors can be measurement sensors that monitor real-time conditions during a drilling process. For example, some sensors monitor the properties of earth formation such as resistivity, density, porosity, permeability, acoustic properties, nuclear-magnetic resonance properties, corrosive properties of the fluids or formation, and salt or saline contents. Other sensors monitor the condition of drilling tools, such as vibrations (lateral, torsional, axial, etc.), orientations, and accelerations in the drill bit or drill strings. Still other sensors monitor the temperature and pressure of the downhole environment. In other embodiments, sensors may be prognostic sensors. Prognostic sensors are subject to more severe conditions than in a typical drilling operation (e.g., higher temperature or pressure) so that they fail at an accelerated rate. They could be used to estimate the time of failure of another component.

Sensors can be mounted on any other suitable components in a drilling assembly. For example, they can be attached to a drill bit to monitor its movement or temperature. Sensors can also be mounted along the borehole, for example, to monitor the pressure or flow rate of the drilling mud along its path. Sensors (e.g., RFID) can even be put into the fluid in the drilling system and be dispersed into the earth formation.

A processor usually is installed on a PCBA. The processor is configured to receive, store, or execute data such as computer codes or sensor signals. For example, a processor can be coupled to a program module which supplies executable instructions and a recording medium that stores various results of calculations performed by the processor. Sensor signals are the input to the processor. PCBAs may also contain telemetry unit so it can transmit sensor signals to a surface instrument for further processing. Conversely, a PCBA may also receive inputs from a surface control unit.

Downhole drilling tools, especially the drilling assembly (a.k.a. BHA), are subject to high temperatures and pressures. Conventional drilling may occur at a temperature up to 125° C. In contrast, bottom hole temperature may exceed 200° C. in deep wells. Such high temperatures drastically reduce the reliability and useful life of downhole electronic components due to leakage current, material degradation, outgassing, corrosion, etc. As a rule of thumb, for every 25° C. increase in temperature, an electronic component would lose 90% of its useful life. Therefore, there are great needs for electronic components that have an adequate operable life, e.g., from a few days to a few weeks, for high temperature drilling operations.

SUMMARY

The present disclosure provides electronic devices, such as PCBAs, which can operate at high downhole temperatures (e.g., 175° C. or higher) during drilling operations. In one embodiment, the printed circuit board assembly has a plurality of chips installed on the circuit board. At least one of the chips comprises an integrated circuit fabricated on an aluminum nitride substrate or on a silicon nitride substrate. In some of the chips, aluminum nitride is used as the oxide layer in a Si-on-Insulator configuration. In other chips, integrated circuits are fabricated on a substrate made from aluminum nitride, silicon nitride, silicon carbide, or sapphire.

In another embodiment, the circuit board of the PCBA is a ceramic circuit board made from ceramic substrates. The ceramic substrates can be aluminum oxide, aluminum nitride, silicon nitride, alumina-zirconium oxide composite, beryllium oxide, or barium titanate substrate. The circuit board can also be made from polyimide laminates.

The PCBA of the current disclosure is used in a drilling system having downhole tools and surface equipment. The PCBA can be installed in the drill collar near the drill bit as a part of MDW/LDW instruments. The PCBA is coupled to sensors to receive and to transmit sensor signals to surface equipment.

BRIEF DESCRIPTION OF THE DRAWINGS

The teachings of the present invention can be readily understood by considering the following detailed description in conjunction with the accompanying drawings.

DETAILED DESCRIPTION

Figure 1:
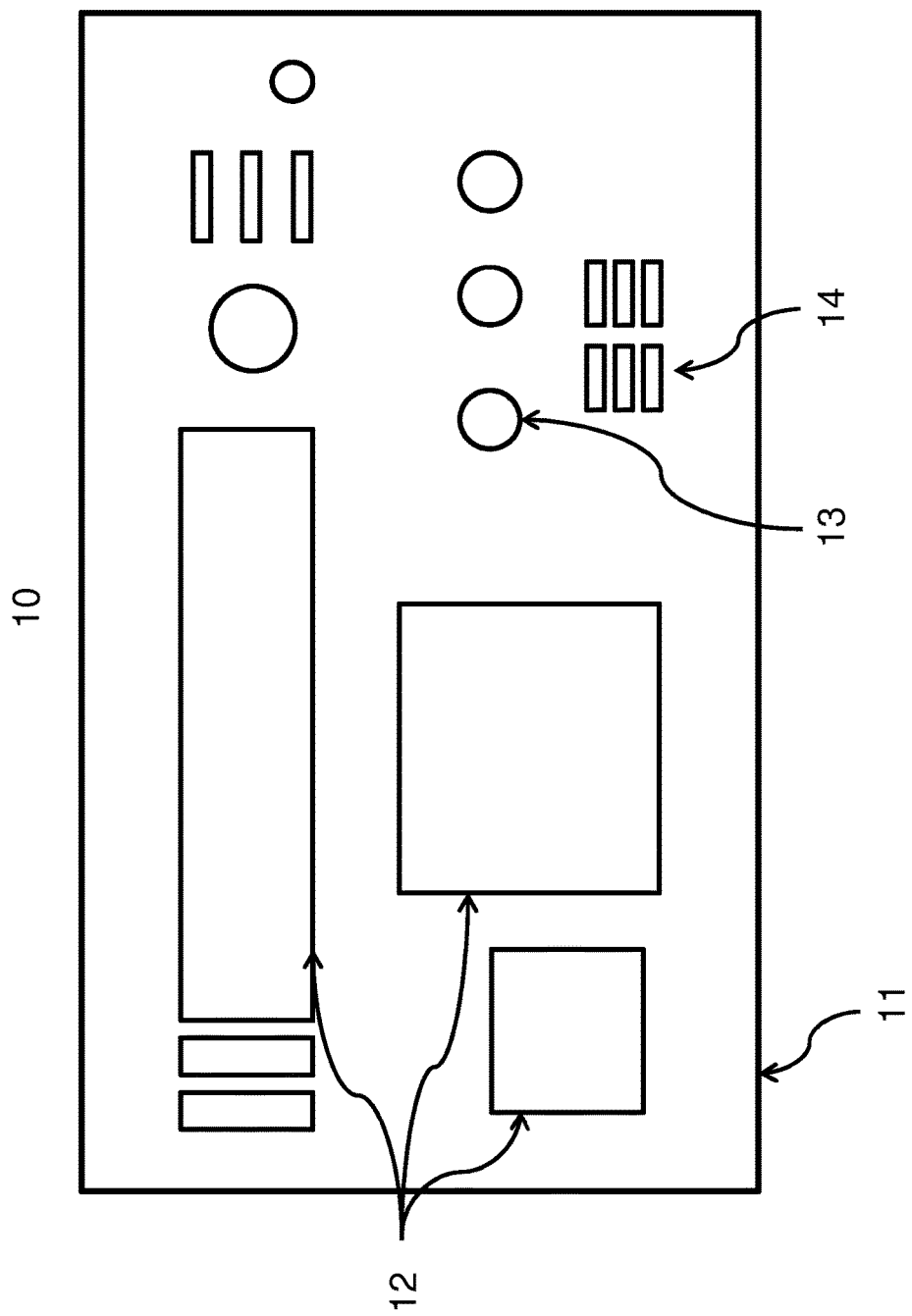
FIG. 1 shows an exemplary printed circuit board assembly.

Reference will now be made in detail to embodiments of the present disclosure, examples of which are illustrated in the accompanying drawings. It is noted that wherever practicable, similar or like reference numbers may be used in the drawings and may indicate similar or like elements.

The drawings depict embodiments of the present disclosure for purposes of illustration only. One skilled in the art would readily recognize from the following description that alternative embodiments exist without departing from the general principles of the present disclosure.

FIG. 1 is a schematic illustration of a printed circuit board assembly (PCBA). The PCBA 10 comprises a printed circuit board (PCB or "the circuit board") 11. A plurality of chips 12 are installed on the circuit board 11. In this disclosure, a chip and a die are used interchangeably. Both refer to an electronic device having integrated circuit fabricated on a substrate. Other electronic components, such as capacitors 13 and resistors 14, are also installed on the circuit board 11. Some of the chips 12 are multichip modules MCM, and others are monolithic chips. The PCBA is coupled to other components in the drilling system through either wired connections or wireless transmissions. For example, the PCBA may have connectors (not shown) configured to connect it to other PCBAs via a bus, or it may have connectors (not shown) for connecting the PCBA with sensors or actuators. The PCBA may also carry wireless transmitters or receivers.

In one embodiment of the PCBA, the base substrate for the PCBA of the current disclosure is made from a ceramic substrate. The ceramic substrate can be an aluminum oxide ($Al_2O_3$) substrate, an aluminum nitride (AlN) substrate, a silicon nitride (SiN) substrate, an alumina-zirconium oxide composite substrate, a beryllium oxide substrate, or barium titanate substrate. The aluminum oxide substrate can be high purity aluminum oxide such as 99.6% alumina or 96% alumina. The ceramic circuit board can sustain high temperatures above 175° C. and frequent thermal cycles while retaining insulation resistance and dielectric constant.

In another embodiment, the circuit board is made from polyimide laminates and prepregs. Polyimide has high $T_g$ (greater than 250° C.). It also has a low z-direction coefficient of thermal expansion (CTE). Commercially available high temperature polyimide laminates and/or prepregs include Arlon 85N manufactured by Arlon MED in Rancho Cucamonga, Calif., and Nelco N7000-2 manufactured by Park Electrochemical Corp. in Melville, N.Y.

One aspect of the ceramic circuit board is that it contains multiple ceramic layers. In addition, the conductor lines (i.e., interconnections) of the ceramic circuit board are made from a Pd-doped Au material. The Pd-doped Au interconnections are suitable for Al or Au wirebonding as the intermetallic interface at the wirebonds are relatively stable, which slows the interdiffusion of Au and Al at high temperatures.

In a further embodiment of the PCBA, the electronic components are attached to the board using a die-attach material. Conventional organic die-attach materials (e.g., epoxy adhesives) may not be suitable for high temperature operation. Instead, metallic die-attach materials, such as Au—Si alloy and Au—Sn alloy, are used.

Soldering can also be employed to attach a chip to the substrate. Suitable solder material include high melting point (HMP) solder wire (e.g., solder alloy 93.5Pb/5.0Sn/1.5Ag), SN96 (e.g., alloy 96.3Sn/3.7Ag), SAC305 (96.5Sn/3.0Ag/0.5Cu), or other suitable high melting point solder materials. In another aspect, the soldering is accomplished using a reflow soldering process. In that case, a solder paste is screen-printed or syringe dispensed on the component pads on the board. The electronic components are then placed on top of the solder paste. The board is then heated according to a pre-determined profile to activate the flux and melt the solder.

Convection heating or radiation heating can be applied to melt the solder. The convention heating can be performed in a hot air oven or by vapor phase heating. In vapor phase reflow soldering, an inert liquid is heated to form an inert vapor phase in the soldering chamber. The PCBA is put into the chamber and evenly heated up by the vapor. Since the vapor is inert and does not mix with air, oxidation is minimized during the soldering process. This oxygen-free soldering only requires a mild flux. Accordingly, the cleaning of flux residue is less stringent.

Figure 2A:
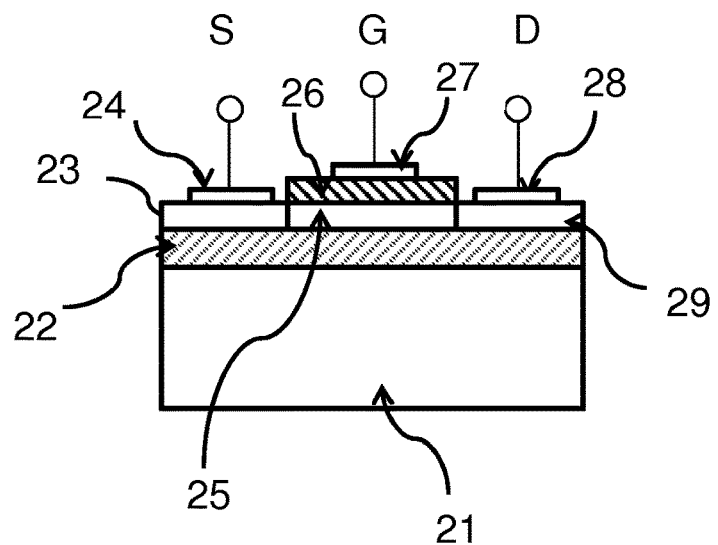
FIGS. 2a and 2b are schematic illustrations of MOS transistors of the current disclosure.

In other embodiments of the PCBA, the chip on the circuit board comprises integrated circuit fabricated using Silicon-on-Insulator (SOI) technology. In one embodiment, AlN is the insulator in the SOI. In one example, the AlN layer is used as the buried insulator layer between a Si top layer and a Si base substrate. In another example, instead of being an oxide layer, AlN is the base substrate on which the integrated circuit is constructed. FIG. 2a shows an example of a Si-on-AlN type metal-oxide-semiconductor (MOS) transistor. As shown, the AlN layer 22 is deposited on a Si substrate 21. Alternatively, a SiN layer can be used instead of the AlN layer. The source junction 23 and the drain junction 29 have the same type of dopant (i.e., either holes or electrons). They are separated by an active region. The insulating oxide layer 26 separates the gate electrode 27 from the rest of the transistor. When a sufficiently high voltage is applied to the gate electrode 27, it creates a channel for charge carriers (e.g. holes or electrons) in the active region 25, connecting the source junction 23 to the drain junction 29. Component 24 is the source electrode and component 28 is the drain electrode.

Figure 2B:
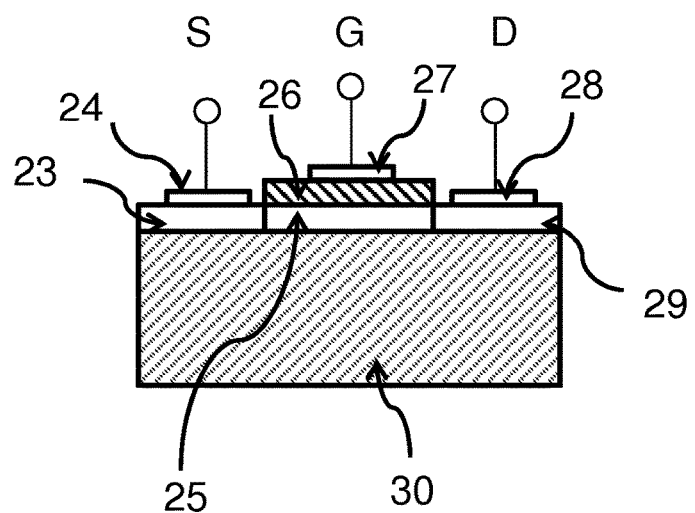

FIG. 2b shows another example of Si-on-AlN MOS transistor. A same reference numeral in FIGS. 2a and 2b refer to a same component. In this case, the transistor is constructed on an AlN substrate 30. No additional Si base substrate or any other base substrate is used.

A pair of complimentary transistors, either the type in FIG. 2a or the type in FIG. 2b, can be connected to form an invertor. Such invertors are the core elements of CMOS integrated circuits. Therefore, the integrated circuit can be constructed on AlN insulating layers or AlN substrates. Chips using the AlN substrate have less current leak at high temperature and better heat dissipation. Therefore, such chips are suitable for high temperature operations. Likewise, substrates such as SiN, SiC, or sapphire can also be used to build Silicon-on-Insulator type chips.

In further embodiments of the PCBA of the current disclosure, the passive components such as resistors and capacitors are suitable for high temperature operations. For example, the resistor can be a nichrome-based resistor or a high temperature chip resistor. High temperature capacitors can be ceramic capacitors, such as C0G capacitors manufactured by Kemet Electronics of Greenville, S.C.

The chips in the PCBA are encapsulated using ceramic materials such as silicon nitride, silicon oxynitride, etc. Epoxy may not be suitable for high temperature operations as it may release bromine at high temperatures, which corrodes the electronic components. The molding material for the chips is also a ceramic material such as silicon nitride.

Another aspect of the PCBA is that at least some of the components are hermetically sealed. Hermetical packaging prevents the protected components from moisture and contaminants. Furthermore, hermetically sealed chips may not need molding. Unlike traditional organic molding compounds such as epoxy, which decompose at high temperature and cause outgassing, corrosion, or deformation, hermetically sealing eliminates these causes for failures.

Embodiments of the present disclosure have been described in detail. Other embodiments will become apparent to those skilled in the art from consideration and practice of the present disclosure. Accordingly, it is intended that the specification and the drawings be considered as exemplary and explanatory only, with the true scope of the present disclosure being set forth in the following claims.

What is claimed is:

1. A drilling system, comprising:
a drilling assembly comprising a drill bit and a drill collar;
a drill string; and
a printed circuit board assembly installed in the drill collar,
wherein the printed circuit board assembly comprises a plurality of chips installed on a printed circuit board, at least one of the chips comprises an integrated circuit fabricated on a silicon nitride substrate, at least one of the chips is a silicon-on-insulator chip having a silicon carbide substrate, at least one wireless transmitter, and at least one wireless receivers, and a sensor circuit coupled with a plurality of sensors for sensing one or more conditions of the drilling bit or the drill string and properties of an earth formation surrounding the drill bit or the drill string, wherein the at least one wireless transmitter is disposed on the printed circuit board assembly; and
a telemetry unit disposed on the printed circuit board assembly coupled with the sensor circuit, wherein the telemetry unit receives a sensor signal from at least one of the plurality of sensors and transmits the sensor signal to a surface location via the at least one wireless transmitter,
wherein the printed circuit board is made from a polyimide prepreg.

2. The drilling system of claim 1, wherein at least one of the plurality of chips is a multi-chip module.

3. The drilling system of claim 1, wherein at least one of the plurality of the chips is a hermetically sealed chip.

4. The drilling system of claim 1, wherein the printed circuit board assembly is operable at a temperature of 175° C.

5. The drilling system of claim 1, wherein all of the plurality of chips on the printed circuit board are encapsulated using silicon nitride or silicon oxynitride.

6. The drilling system of claim 1, wherein all of the plurality of chips on the printed circuit board are hermetically sealed.

* * * * *